(12) United States Patent
Kashima

(10) Patent No.: US 6,178,319 B1
(45) Date of Patent: Jan. 23, 2001

(54) MICROWAVE MIXING CIRCUIT AND DOWN-CONVERTER

(75) Inventor: Yukiro Kashima, Osaka (JP)

(73) Assignee: Matsushita Electric Industrial Co., Ltd., Osaka (JP)

(*) Notice: Under 35 U.S.C. 154(b), the term of this patent shall be extended for 0 days.

(21) Appl. No.: 09/159,795

(22) Filed: Sep. 24, 1998

(30) Foreign Application Priority Data

Sep. 26, 1997 (JP) .................................................. 9-261674

(51) Int. Cl.⁷ ........................................................ H04B 1/26
(52) U.S. Cl. ............................ 455/323; 455/318; 455/333
(58) Field of Search ............................................. 455/323, 325, 455/330, 333, 318, 293; 327/105

(56) References Cited

U.S. PATENT DOCUMENTS

| 4,509,198 | 4/1985 | Nagatomi . |
| 5,584,064 | 12/1996 | Nakamura . |

FOREIGN PATENT DOCUMENTS

| 0 523 770 A1 | 6/1992 | (EP) . |
| 0 759 656 A1 | 2/1997 | (EP) . |
| 05022248 | 1/1993 | (JP) . |
| 5-167352 | 7/1993 | (JP) . |
| 7-211969 | 8/1995 | (JP) . |
| 8-45741 | 2/1996 | (JP) . |
| 9-121177 | 5/1997 | (JP) . |

Primary Examiner—Curtis A. Kuntz
Assistant Examiner—Melur Ramakrishnaiah
(74) Attorney, Agent, or Firm—Ratner & Prestia

(57) ABSTRACT

A microwave mixing circuitry has a plurality of microwave signal input terminals, a local oscillator for outputting a local oscillation signal for the purpose of generating an intermediate frequency signal from the microwave signal input by the microwave signal input terminals, and a plurality of field effect transistors ("FET") for frequency converting. The FET gates are input with the microwave signal input from microwave signal input terminals. The FET drains are input with an output of the local oscillator. A plurality of gate voltage control circuitries control gate voltages of the FETs thereby causing one of the FETs to perform nonlinear operation while turning off another of FETs at the same time. An intermediate frequency signal output terminal outputs the intermediate frequency signal produced by the nonlinear operation of one of the FETs.

19 Claims, 5 Drawing Sheets

MICROWAVE MIXING CIRCUIT AND DOWN-CONVERTER

FIELD OF THE INVENTION

The present invention relates to a microwave mixing circuit and a down-converter incorporating the same for receiving satellite broadcasting and communication via broadcasting satellites and communication satellites.

BACKGROUND OF THE INVENTION

There are increasing occasions for ordinary households to directly receive a plurality of satellite broadcastings in recent years, as satellite broadcastings have come to a stage of being wide spread and communication satellite broadcastings in digital signal have since started using commercial communication satellites. With this trend, there is an increasing demand for reduction in both size and cost of antennas for receiving the broadcastings. In case of the communication satellite broadcastings, receiving antennas often incorporate therein a low-noise down-converter having a polarization selecting function since they are multi-channel broadcastings by utilizing electromagnetic waves of different polarizations (e.g. horizontally polarized waves and vertically polarized waves) of same frequency for a reason of efficient use of the frequencies.

A microwave mixing circuitry and an intermediate frequency amplifier having polarization selecting function of the prior art are described hereinafter by referring to FIG. 5.

Both horizontally and vertically polarized microwave signals (e.g. signals in a frequency band of 12 GHz) input to microwave signal input terminals 101 and 102 are converted into intermediate frequency signals of 1 GHz in Schottky barrier diodes (hereinafter referred to as "SBD") 148 and 149 for frequency conversion connected to microwave strip transmission lines (hereinafter referred to as "MSL") 106 and 107 by being mixed respectively with local oscillation signals (e.g. signals of 11.2 GHz) supplied from a local oscillator 103 via band-pass filters (hereinafter referred to as "BPF") 104 and 105.

Here, a frequency conversion loss in the SBD's 148 and 149 increases in case that an output of the local oscillation signal supplied by the local oscillator 103 is small. The SBD's 148 and 149 are provided with bias currents in the forward direction in order to prevent an increase of the frequency conversion loss. These bias currents are supplied from bias terminals 110 and 111 through connections with anodes of the SBD's 148 and 149.

The intermediate frequency signals that have passed through lowpass filters (hereinafter referred to as "LPF") 112 and 113, which allow the intermediate frequency signals to pass through, further pass through PIN diodes 138 and 139 after having amplified by intermediate frequency amplifiers 134, 135, 136 and 137.

Current supply terminals of the intermediate frequency amplifiers 134 and 135 and an anode of the PIN diode 138 are connected with a collector of a transistor 142 through an input signal selection control terminal (hereinafter referred to as "polarization selection control terminal") 146 for selecting between input signals of horizontally polarized waves and vertically polarized waves.

Likewise, current supply terminals of the intermediate frequency amplifiers 136 and 137 and an anode of the PIN diode 139 are connected with an emitter of a transistor 143 through a polarization selection control terminal 147.

The microwave mixing circuitry is supplied with a polarization selection signal (e.g. a D.C. voltage of either 11 V or 15 V) from the outside through an intermediate frequency signal output terminal 145.

A comparator 144 outputs a D.C. signal of different values in response to the polarization selection signal.

In the event the polarization selection signal is 11 V, the transistor 142 turns on and the transistor 143 turns off simultaneously. As a consequence, an electrical potential of the polarization selection control terminal 146 increases whereas that of the control terminal 147 decreases.

On the other hand, in the event the polarization selection signal is 15 V, the transistor 143 turns on and the transistor 142 turns off simultaneously. Hence, the electrical potential of the control terminal 147 increases whereas that of the control terminal 146 decreases.

In case the polarization selection signal is 11 V, the intermediate frequency amplifiers 134 and 135 and the PIN diode 138 turns on and the intermediate frequency amplifiers 136 and 137 and the PIN diode 139 turns off, so that intermediate frequency amplifiers 140 and 141 are supplied with an intermediate frequency signal corresponding to the horizontally polarized microwave signal input through the microwave signal input terminal 101, and the signal is output from the intermediate frequency signal output terminal 145 after being amplified to a desired magnitude.

In the same way, if the polarization selection signal is 15 V, the intermediate frequency amplifiers 134 and 135 and the PIN diode 138 turns off and the intermediate frequency amplifiers 136 and 137 and the PIN diode 139 turns on, so that intermediate frequency amplifiers 140 and 141 are supplied with an intermediate frequency signal corresponding to the vertically polarized microwave signal input through the microwave signal input terminal 102, and the signal is output from the intermediate frequency signal output terminal 145 after being amplified to a desired magnitude.

With this structure of the prior art, however, it is quite difficult to reduce the size as is also inimical to the cost reduction because it requires the intermediate frequency amplifiers 134, 135, 136 and 137 and the PIN diodes 138 and 139 responsive to the microwave signal input terminals 101 and 102 to which two different polarized waves are input.

SUMMARY OF THE INVENTION

A microwave mixing circuitry having a plurality of microwave signal input terminals, a local oscillator for outputting a local oscillation signal for the purpose of generating an intermediate frequency signal from microwave signal input by microwave signal input terminals, a plurality of field effect transistors ("FET") for converting frequency, of which gates are input with the microwave signal input from microwave signal input terminals, and of which drains are input with an output of local oscillator, a plurality of gate voltage control circuitries for controlling gate voltages of FET's thereby causing one of FET's to perform nonlinear operation while turning off the another of FET's at the same time, and an intermediate frequency signal output terminal for outputting the intermediate frequency signal produced by the nonlinear operation of one of the FET's.

The microwave mixing circuitry of the present invention is able to select one microwave signal among a plurality of different signals and convert it into intermediate frequency signal by controlling the gate voltages of the FET's for converting frequency with the gate voltage control circuitries.

DESCRIPTION OF THE PREFERRED EMBODMENTS

First Exemplary Embodiment

Figure 1:
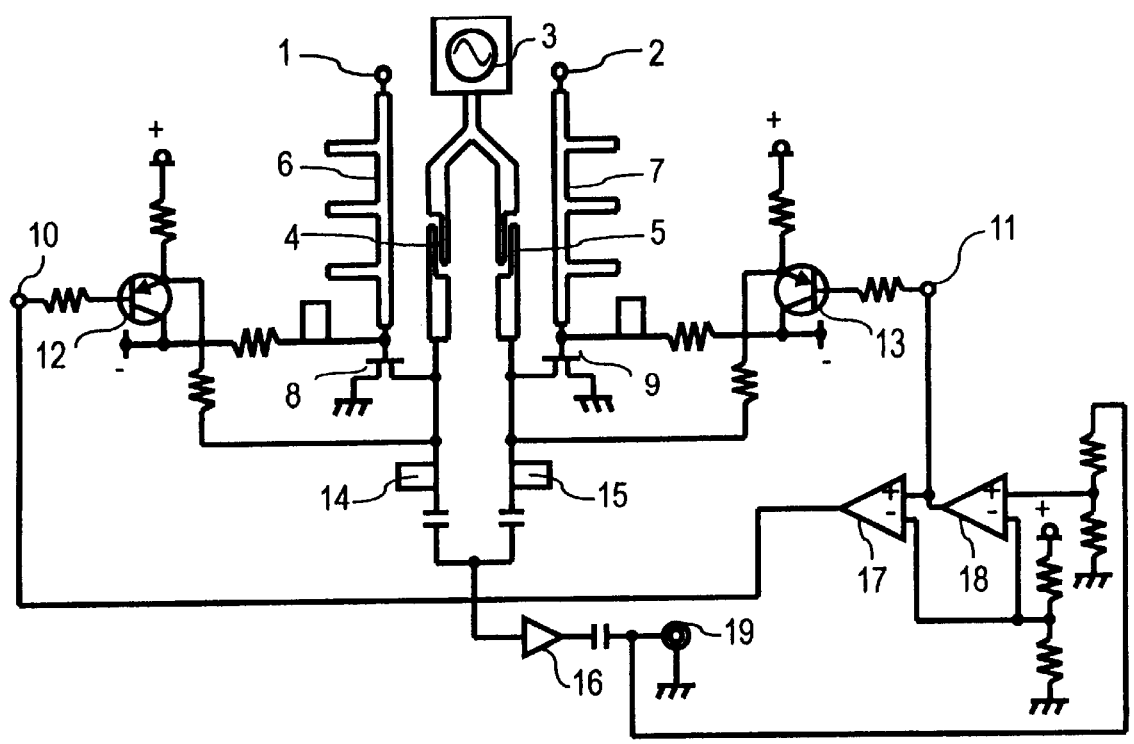
FIG. 1 depicts a circuit pattern of a microwave mixing circuitry of a first embodiment of the present invention.

A microwave mixing circuitry and an intermediate frequency amplifier of a first embodiment of the present invention are described hereinafter by referring to a circuit pattern drawing of FIG. 1.

The microwave mixing circuitry of the present embodiment comprises: microwave signal input terminals 1 and 2 corresponding to, for instance, horizontally polarized wave signal and vertically polarized wave signal; a local oscillator 3; band-pass filters ("BPF") 4 and 5 for passing local frequency; microwave strip transmission lines ("MSL") 6 and 7; gallium arsenide FET's (hereinafter referred to as "FET") 8 and 9 for converting frequency; transistors 12 and 13 functioning as gate voltage control circuitries for supplying bias voltages to gates and drains of the FET's; bias terminals 10 and 11 for supplying bias voltages to bases of the transistors; low-pass filters ("LPF") 14 and 15 for passing intermediate frequency signals; an intermediate frequency amplifier 16; and comparators 17 and 18 composing a bias selection circuitry for selecting the bias voltages to be supplied to the bias terminals 10 and 11.

The intermediate frequency signal output terminal 19 outputs the intermediate frequency signal, while it also receives at the same time an input selection signal (e.g. a D.C. voltage of 11 V or 15 V) from the outside (e.g. a tuner for receiving satellite broadcastings) for switching an input between horizontally polarized microwave signal and vertically polarized microwave signal.

The microwave mixing circuitry and an intermediate frequency amplifier of the above structures operate in a manner, which is described hereinunder. Since both of the horizontally polarized microwave signal and the vertically polarized microwave signal are processed by circuitries of similar structure, the descriptions are partly omitted hereupon.

First, described below is the operation in case the input selection signal received externally at the intermediate frequency signal output terminal 19 is a D.C. voltage of 15 V.

Microwave signal of the 12 GHz band input to the microwave signal input terminals 1 corresponding to the horizontally polarized wave is introduced through the MSL 6 to the gate of the FET 8 connected with the MSL 6, and it is mixed in the FET 8 with a local oscillation signal (e.g. 11.2 GHz) which is input to the drain from the local oscillator 3 through the BPF 4. Source of the FET 8 is connected with the earth-ground.

Both of the transistors 12 and 13 of the NPN type are connected to a positive side of a power supply via emitter resistors and to a negative side of the power supply via collector resistors.

The gate of the FET 8 connected with the MSL 6 is connected to a collector of the transistor 12 via a filter and a resistor, and the drain of the FET 8 and an emitter of the transistor 12 are connected via another resistor.

The comparator 18 outputs a voltage of high potential and the comparator 17 outputs a voltage of low potential to the bias terminal 10 in response to the input selection signal of 15 V D.C. The bias terminal 10 is connected to a base of the transistor 12 via yet another resistor. Accordingly, a base potential of the transistor 12 connected with the bias terminal 10 becomes low, so as to cause the transistor 12 to turn on. Hence, with a stable supply of bias voltage from the transistor 12, the FET 8 for converting frequency carries out an apposite nonlinear operation to convert the microwave signal of 12 GHz band into an intermediate frequency signal of 1 GHz band with an efficient conversion gain.

The converted intermediate frequency signal is then introduced to the intermediate frequency amplifier 16 after passing through the LPF 14 and a D.C. blocking capacitor.

On the other hand, the vertically polarized microwave signal of the 12 GHz band input at the microwave signal input terminals 2 is introduced through the MSL 7 to the gate of the FET 9 connected with the MSL 7, and it is mixed in the FET 9 with a local oscillation signal (e.g. 11.2 GHz) input to the drain from the local oscillator 3 through the BPF 5. Source of the FET 9 is connected with the earth-ground.

The gate of the FET 9 connected with the MSL 7 is coupled to a collector of the transistor 13 via a filter and a resistor, and the drain of the FET 9 and an emitter of the transistor 13 are coupled via another resistor.

The comparator 18 outputs a voltage of high potential to the bias terminal 11 in response to the input selection signal of 15 V D.C. The bias terminal 11 is connected to the base of the transistor 13 via a resistor. The base of the transistor 13 is supplied with the voltage of high potential via the bias terminal 11.

In this way, the transistor 13 turns off, and as a result, the FET 9 for frequency conversion turns off so as not able to convert the frequency with the nonlinear operation in an appropriate manner. Consequently, the intermediate frequency signal in the frequency band of 1 GHz corresponding only to the horizontally polarized wave input to the microwave signal input terminals 1 appears at an input side of the intermediate frequency amplifier 16. And the intermediate frequency signal is output from the intermediate frequency signal output terminal 19 through a D.C. blocking capacitor after being amplified to a desired magnitude by the intermediate frequency amplifier 16.

Next, described below is the operation in case of the input selection signal being 11 V.

The comparator 18 outputs a low potential and the comparator 17 outputs a high potential. Therefore, the high potential for the bias terminal 10 and the low potential for the bias terminal 11 are respectively output, and the FET 9 receives the bias voltage from the transistor 13 whereas the FET 8 does not receive the bias voltage from the transistor 12, thereby resulting in an output of intermediate frequency signal corresponding to the vertically polarized wave from the intermediate frequency signal output terminal 19.

As has been described, the microwave mixing circuitry of the present invention is able to select one microwave signal between the two different signals and convert it into intermediate frequency signal by controlling the bias voltage applied to the gates and the drains of the FET's for frequency conversion with a simple bias selection circuitry using comparators.

Although in the described embodiment the input selection signal is D.C. voltage, it is not limited only to D.C. voltage but it may be A.C. voltage or any form of pulses or other signals of which differences shall be distinguishable.

Also, the microwave signals being input are described in the embodiment as two signals in different plane of polarization, but the microwave mixing circuitry of the present invention is also able to work properly even if they are two microwave signals being input from two satellites in different incident direction.

Furthermore, the present embodiment does not limit the number of the input microwave signals to two signals, but it is able to realize a microwave mixing circuitry that is capable of processing three or more input microwave signals by expanding the embodiment if there are more than two signals.

Second Exemplary Embodiment

A microwave mixing circuitry and an intermediate frequency amplifier of a second embodiment of the present invention are described hereinafter by referring to a circuit pattern drawing of FIG. 2.

Figure 2:
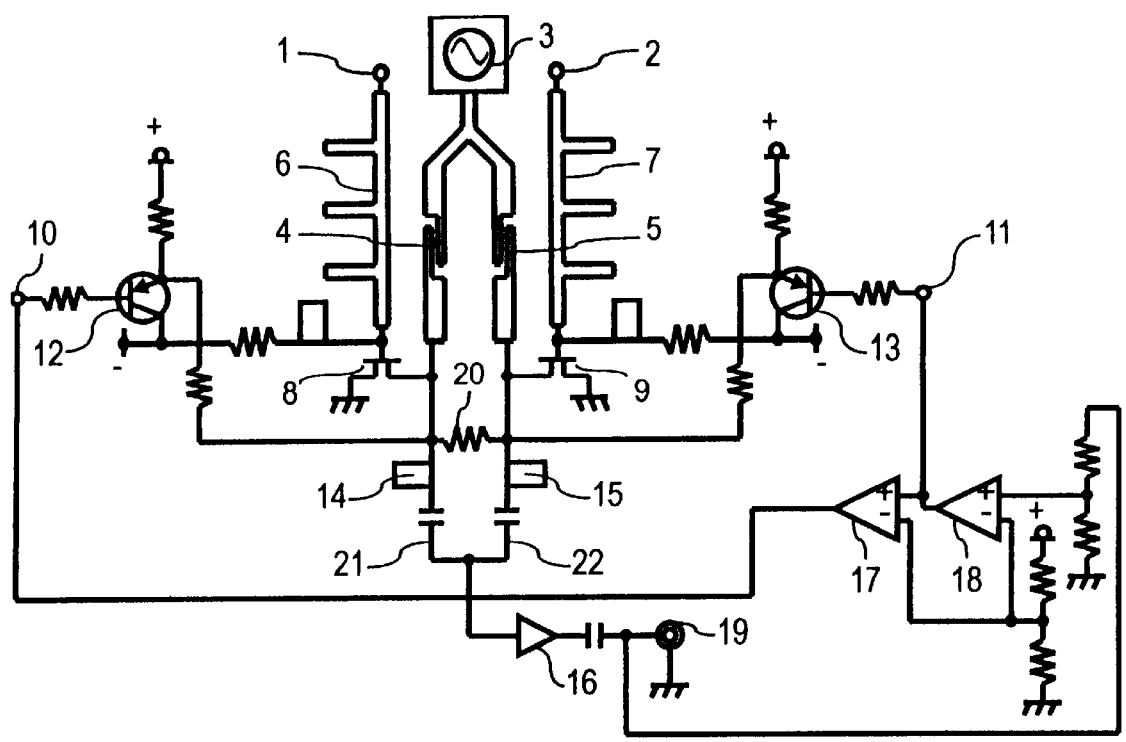
FIG. 2 depicts a circuit pattern of a microwave mixing circuitry of a second embodiment of the present invention.

What are shown in FIG. 2 are identical to the circuit pattern drawing of the microwave mixing circuitry and the intermediate frequency amplifier of the first embodiment as depicted in FIG. 1 except for those described below. Therefore, descriptions pertaining to the portions that are of the same structural components having the same functions as FIG. 1 are omitted.

Structural components that differ from FIG. 1 are an absorbing resistor 20 and MSL's 21 and 22 that have a line length of one quarter of a wavelength of the intermediate frequency signal in the 1 GHz band.

The absorbing resistor 20 is connected between a line connecting the drain of the FET 8 with the LPF 14 and another line connecting the drain of the FET 9 with the LPF 15. The MSL 21 is connected between a D.C. blocking capacitor succeeding the LPF 14 and the intermediate frequency amplifier 16, and the MSL 22 is connected between a D.C. blocking capacitor succeeding the LPF 15 and the intermediate frequency amplifier 16, respectively.

The MSL 21 and the MSL 22, together with the absorbing resistor 20, constitute a Wilkinson-type divider for ensuring isolation between the lines.

In a word, the Wilkinson-type divider eliminates mutual interference between each of the outputs from the FET's 8 and 9 and the intermediate frequency amplifier 16.

In the same manner as the first embodiment, if the input selection signal provided externally to the intermediate frequency signal output terminal 19 is a D.C. voltage of 15 V, only the intermediate frequency signal of 1 GHz band corresponding to the horizontally polarized wave input to the microwave signal input terminals 1 appears at the input side of the intermediate frequency amplifier 16. The intermediate frequency signal is then output from the intermediate frequency signal output terminal 19 after being amplified to a desired magnitude by the intermediate frequency amplifier 16.

Similarly, in case the input selection signal provided externally to the intermediate frequency signal output terminal 19 is a D.C. voltage of 11 V, only the intermediate frequency signal of 1 GHz band corresponding to the vertically polarized wave input to the microwave signal input terminals 2 appears at the input side of the intermediate frequency amplifier 16. The intermediate frequency signal is then output from the intermediate frequency signal output terminal 19 after being amplified to a desired magnitude by the intermediate frequency amplifier 16.

As has been described, the microwave mixing circuitry of the present invention is able to select the desired microwave signal among a plurality of different microwave signals and to convert it into intermediate frequency signal by controlling the bias voltage applied to the gates and the drains of the FET's for frequency conversion with a simple bias selection circuitry using comparators. In addition, the microwave mixing circuitry of the present invention, in combination with the Wilkinson-type divider, is able to select the desired microwave signal among a plurality of the different microwave signals and to convert it efficiently at low cost.

Although in the described embodiment the input selection signal is D.C. voltage, it is not limited only to D.C. voltage but it may be either A.C. voltage or any form of pulses or other signals of which differences need to be distinguishable.

Also, the microwave signals being input are described as two signals in different plane of polarization, but the microwave mixing circuitry of the present invention is also capable to work properly even if they are two microwave signals being input from two satellites in different incident direction.

Third Exemplary Embodiment

A down-converter of a third embodiment of the present invention is described hereinafter by referring to a circuit pattern drawing of FIG. 3.

Figure 3:
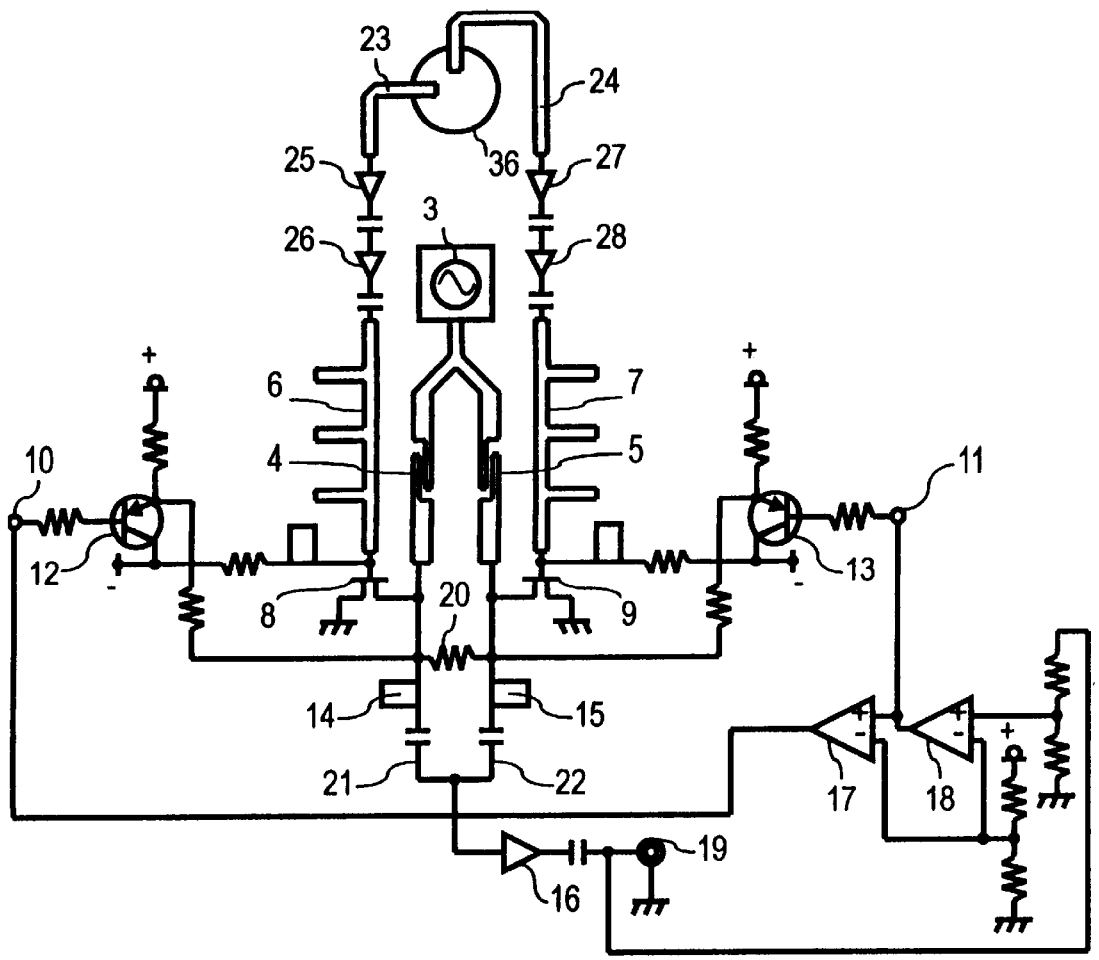
FIG. 3 depicts a circuit pattern of a down-converter of a third embodiment of the present invention.

This embodiment differs from the second embodiment in respect of a waveguide input port 36, probes 23 and 24, and low noise amplifiers 25, 26, 27 and 28 comprising low-noise devices such as high electron mobility transistors ("HEMT"), which are added to the structure of FIG. 2, as shown in FIG. 3. All other structural components are the same components having the same functions as in FIG. 2 of which descriptions are therefore omitted.

The down-converter of the above structure operates in a manner, which is described hereinunder.

Microwave signal of horizontally polarized wave emitted from a satellite is input to the waveguide input port 36, converted by the probe 23 into quasi-transversal electromagnetic mode wave ("Q-TEM wave") for transmission in the MSL, low-noise amplified by the low-noise amplifiers 25 and 26, and via MSL6 introduced to the gate of the FET 8.

Likewise, microwave signal of vertically polarized wave emitted from the satellite is input to the waveguide input port 36, converted by the probe 24 into Q-TEM wave for transmission in the MSL, low-noise amplified by the low-noise amplifiers 27 and 28, and via MSL7 introduced to the gate of the FET 9.

Descriptions are omitted for certain operation, where the selected microwave signal as converted into the intermediate frequency signal is output from the intermediate frequency signal output terminal 19 after the microwave signals are input to the FET's 8 and 9, since they are same as those described in the second embodiment.

The down-converter, which utilizes the microwave mixing circuitry depicted in FIG. 2, is composed in this way.

As the result, this down-converter is capable of selecting the desired microwave signal among a plurality of different microwave signal input from the waveguide input port and capable of converting it into an intermediate frequency signal by controlling the bias voltage applied to the gates and the drains of the FET's for frequency conversion with a simple bias selection circuitry using comparators, and, at the same time, it is able to select the desired microwave signal among a plurality of different microwave signal inputs and to convert it efficiently in combination with the Wilkinson-type divider.

Although the input selection signal as described in this embodiment is D.C. voltage, it is not limited only to D.C. voltage but it may be either A.C. voltage or any form of pulses or other signals of which differences are to be distinguishable.

Fourth Exemplary Embodiment

A down-converter of a fourth embodiment of the present invention is described hereinafter by referring to a circuit pattern drawing of FIG. 4. This embodiment pertains to a down-converter for receiving signals emitted from two different satellites and enables it to select a polarized wave in accordance with the first input selection signal and to select a satellite in accordance with the second input selection signal. In the down-converter of this embodiment shown in the FIG. 4, only the different operation from in FIG. 3 is explained.

A wave guide input ports 36 or 37 receives each wave from two different satellites. Probes 23, 24, 31 and 32 convert microwave signals of the 12 MHz band emitted from the satellites in horizontal and vertical planes of polarization into Q-TEM waves for transmission in the MSL's. Low-noise amplifiers 25, 26, 27, 28, 29 and 30 comprise low-noise devices such as HEMT's. MSL 33 is connected to the low-noise amplifiers 25, 26 and MSL 34 is connected to the low-noise amplifiers 28, 29. An intermediate frequency signal output terminal 19 outputs the intermediate frequency signals and also is supplied with a first input selection signal for selecting a polarized wave (e.g. a D.C. voltage of 11 V or 15 V) from outside (e.g. a tuner for receiving satellite broadcastings). A polarization selection control circuitry 35 controls operation of the low-noise amplifiers 25, 26 and 27 or 28, 29 and 30 according to the first input selection signal. A BPF 38 selects and amplifies a second input selection signal for selecting any one of satellites (e.g. a pulse signal of 32 kHz to 48 kHz) supplied into the intermediate frequency signal output terminal 19 from the outside, separating from the first input selection signal. A detection circuitry 39 for detects the pulse signal from the BPF 38 and converts into D.C. voltage.

Operation of the down-converter constructed as above is described hereinafter in comparison with FIG. 3. The description pertaining to circuitry having the same components and functions as in the third embodiment are omitted.

This embodiment differs from the third embodiment in the following respects:

1) certain structural components are added in conjunction with the two waveguide input ports 36 and 37;

2) the first input selection signal (e.g. a D.C. voltage of 11 V or 15 V) for selecting a polarized wave and the second input selection signal (e.g. pulse signal of 32 kHz to 48 kHz) for selecting a satellite are input from outside through the intermediate frequency signal output terminal 19;

3) polarization selection is made by the polarization selection control circuitry 35 according to the first input selection signal (e.g. a D.C. voltage of 11 V or 15 V), and the selection is executed by switching on or off of the low-noise amplifiers 25, 26, 27, and 28, 29, 30 coupled with the waveguide input units 36 and 37; when receiving horizontally polarized wave signals, the amplifiers 25, 27, 28, and 30 are switched on and the amplifiers 26 and 29 are switched off; when receiving vertically polarized wave signals, the amplifiers 26, 27, 29, and 30 are switched on whereas the amplifiers 25 and 28 are switched off; and 4) selection of satellite is made by separating a signal from the second input selection signal (e.g. pulse signal of 32 kHz to 48 kHz) with a bandpass filter 38 and detecting it with a detection circuitry 39, and by turning on/off of the transistors 12 and 13 with the comparators 17 and 18, thereby turning the FET's 8 and 9 for frequency conversion on/off, or, in short, selecting a satellite by turning on/off of the FET's for frequency conversion.

Figure 4:
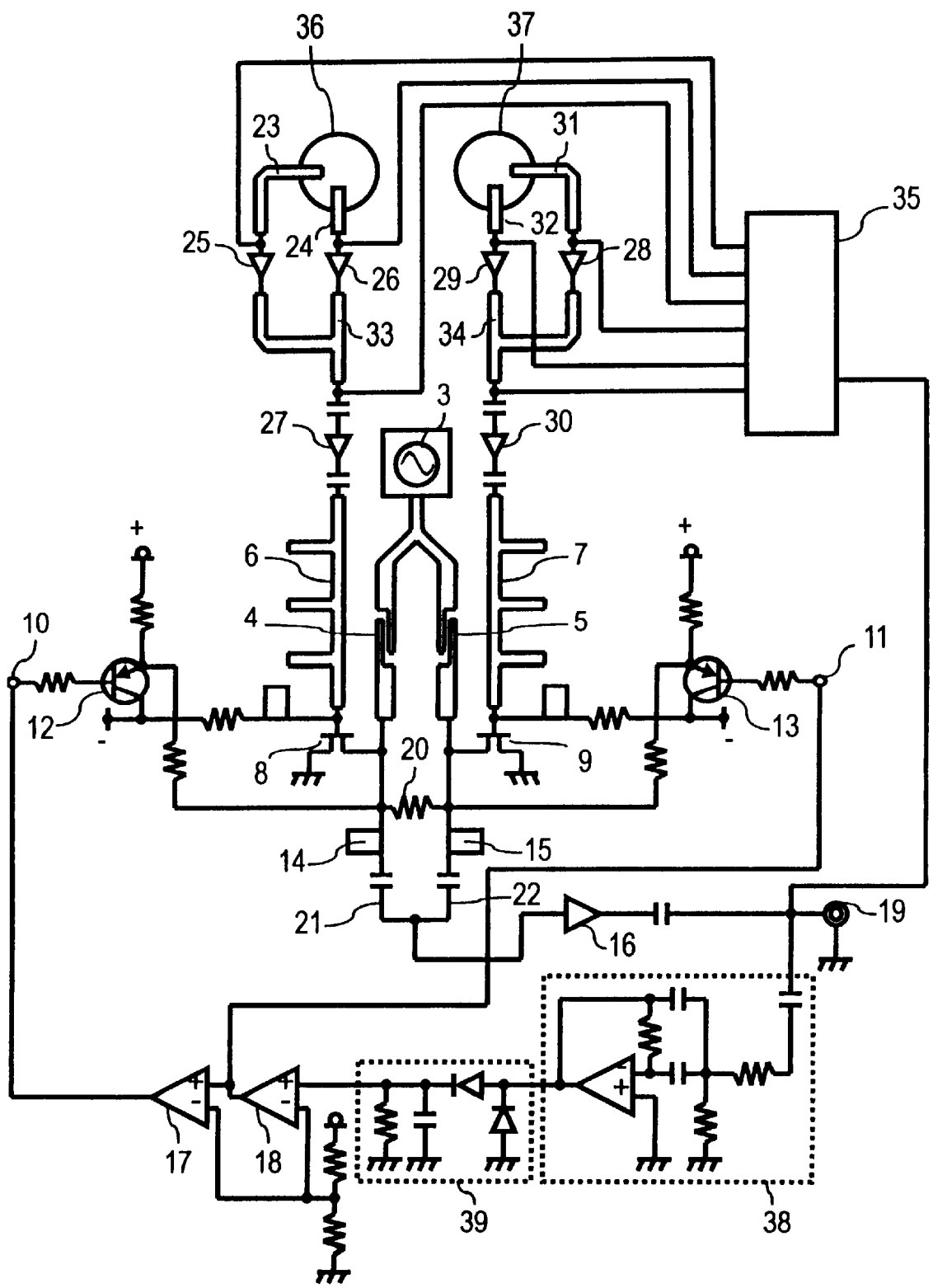
FIG. 4 depicts a circuit pattern of a down-converter of a fourth embodiment of the present invention.
Figure 5:
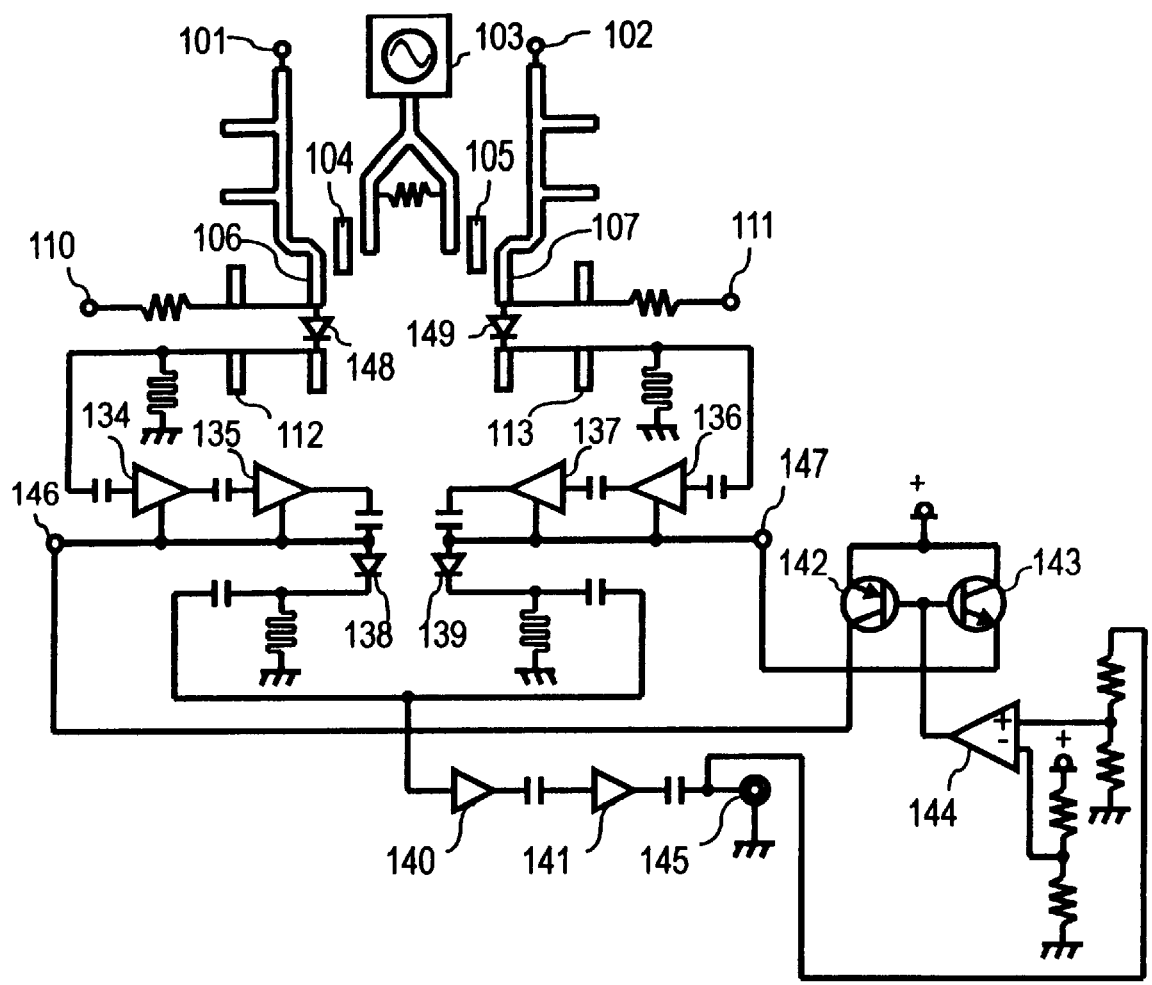
FIG. 5 depicts a circuit pattern of a microwave mixing circuitry of the prior art.

The circuitry of FIG. 4 is described as follows.

Microwave signals of horizontally polarized wave emitted from two different satellites are converted by the probes 23 and 31 disposed respectively in the waveguide input ports 36 and 37 into Q-TEM waves for transmission in the respective MSL's.

In the same manner, microwave signals of vertically polarized wave emitted from two different satellites are converted by the probes 24 and 32 disposed respectively in the waveguide input ports 36 and 37 into Q-TEM waves for transmission in the respective MSL's.

First, described below is a case in that the first input selection signal of 15 V in D.C. is supplied to the intermediate frequency signal output terminal 19.

The down-converter receives the horizontally polarized wave signals in this case.

The polarization selection control circuitry 35 outputs the first input selection signals to switch on the low-noise amplifiers 25 27 and 28, 30, and to switch off the low-noise amplifiers 26 and 29. Microwave signals of horizontally polarized wave emitted from two different satellites are converted into Q-TEM waves for transmission in the MSL's by the probes 23 and 31 disposed inside the respective waveguide input ports 36 and 37.

The converted Q-TEM waves are introduced via MSL 6 to the gate of the FET 8 and via MSL 7 to the gate of the FET 9, after being amplified with the low-noise amplifiers 25 and 28 selected by the polarization selection control circuitry 35, passing through the MSL 33 and the MSL 34, and being amplified furthermore with the low-noise amplifiers 27 and 30.

During this period, the vertically polarized wave signals are not amplified because the low-noise amplifiers 26 and 29 are switched off.

Described next is a case that the first input selection signal of 11 V in D.C. is supplied to the intermediate frequency signal output terminal 19.

In this case, signals to be introduced to the gate of the FET 8 connected to the MSL 6 and to the gate of the FET 9 connected to the MSL 7 are the vertically polarized wave signals, to the contrary of the above-mentioned case.

The selection of a satellite is made according to the second input selection signal (e.g. pulse signal of 32 kHz to 48 kHz) which is superposed on the 15 V in D.C. and supplied from the intermediate frequency signal output terminal 19.

The second input selection signal is extracted by the BPF 38, and transmitted at the same time to the comparator 18 after being amplified and converted into D.C. voltage in the detection circuitry 39.

This results in the comparator 17 to supply a voltage of low potential to the base of the transistor 12 through the bias terminal 10, as described in the first exemplary embodiment, so as to turn on the transistor 12 for providing the FET 8 with the stable bias from the transistor 12.

Hence, the vertically polarized microwave signal input to the waveguide input port 36 is converted into an intermediate frequency signal in the 1 GHz band with an efficient conversion gain, and introduced to the intermediate frequency amplifier 16 after passing through the LPF 14.

Likewise, in case the second input selection signal is not supplied to the intermediate frequency signal output terminal 19, the vertically polarized microwave signal input to the waveguide input port 37 is output from the intermediate frequency signal output terminal 19 after being converted in accordance with the intermediate frequency signal, because the FET 9 is supplied with the bias voltage whereas the FET 8 is not.

Incidentally, the mixing circuitry and the intermediate frequency amplifier circuitry provided with this down-converter are not described, as they are identical to those of the FIG. 3.

As has been described, the present invention realizes the microwave mixing and the down-converter, which are small in size and low cost, yet able to select the desired signal among a plurality of different microwave input signals and to convert it into intermediate frequency signal, by comprising the bias voltage supply circuitry for supplying bias voltages to the gates and the drains of the FET's for frequency conversion with an addition of a simply composed bias selection circuitry that controls the bias voltages for the bases of the transistors.

What is claimed is:

1. Microwave mixing circuitry comprising:
   a plurality of separate microwave signal input terminals each for receiving a horizontally polarized wavesignal and a vertically polarized wave signal, repsectively;
   local oscillator for geneating a local oscillation signal;
   a plurality of mixing circuitries for mixing each of said horizontally polarized wave signal and said vertically polarized wave signal, said mixing circuitries include field effect transistors ("FETs") having gates coupled to said microwave signal input terminals, and drains which are coupled to said local oscillator;
   a plurality of control circuitries for enabling operation of one of said mixing circuitries while preventing operation of another of said mixing circuitries to produce an intermediate frequency signal; and
   an intermediate frequency signal output terminal for outputting the intermediate frequency signal produced by the operation of one of said mixing circuitries.

2. The microwave mixing circuitry as recited in claim 1, wherein each of said control circuitries includes a transistor having a collector which is coupled with a gate of one of said FETs, an emitter which is coupled with a drain of said one of said FETs and a base which is coupled with a bias selection circuitry for supplying a bias voltage to the base.

3. The microwave mixing circuitry as recited in claim 2, wherein said bias selection circuitry causes one of said FETs to perform nonlinear operation and another of said FETs to turn off by a magnitude of electrical potential being applied to the base of said transistor.

4. The microwave mixing circuitry as recited in claim 3, wherein there are two of said transistors, and said bias selection circuitry comprises two stages of comparators, an output of a first stage thereof is input to the base of one of said transistors and an output of a second stage thereof is input to the base of the other of said transistors.

5. The microwave mixing circuitry as recited in claim 1, wherein a Wilkinson type divider is provided between the drain of each of said FETs and said intermediate frequency signal output terminal.

6. The microwave mixing circuitry as recited in claim 1, said microwave mixing circuitry included in a down converter, said down converter further comprising a plurality of probes coupled to said input terminals for converting the input microwave signal into a transversal electromagnetic mode wave ("TEM wave"), wherein a low-noise amplifier is coupled to each of said plurality of probes.

7. The microwave mixing circuitry as recited in claim 1, said microwave mixing circuitry included in a down converter, said down converter further comprising a plurality of waveguide input ports corresponding to different signal sources, a plurality of probes coupled to said input terminals for converting the microwave signal input from each of said plurality of waveguide input ports into TEM wave, and a low-noise amplifier coupled to each of said plurality of probes.

8. The microwave mixing circuitry as recited in claim 7, wherein said down converter is further comprising a selection circuitry for switching on or off the outputs of said plurality of low-noise amplifiers.

9. The microwave mixing circuitry as recited in claim 8, wherein said selection circuitry selects a polarization according to a first input selection signal and selects a satellite by switching on or off nonlinear operation of said FET according to a second input selection signal.

10. The microwave mixing circuitry as recited in claim 9 further comprising a band-pass filter circuitry for separating said second input selection signal and a detection circuitry for detecting the separated signal by said band-pass filter circuitry.

11. A microwave mixing circuitry with a couple of microwave input signals comprising:
   (a) a couple of microwave signal input terminals each for receiving one of said microwave input signals,
   (b) a local oscillator for outputting a microwave oscillation signal,
   (c) a couple of field-effect transistors ("FETs") for mixing said microwave input signals with said microwave oscillation signal,
   (d) a control circuitry for switching a first FET of said FETs to operative state and switching a second FET of said FETs to inoperative state,
   (e) an intermediate frequency signal output terminal for outputting an intermediate frequency signal produced by said first FET,
   wherein said each microwave input signal and said microwave oscillation signal are fed into the gate and the drain of said FETs respectively, and wherein said control circuitry supplies to each gate of FETs a bias voltage which enables one of said FETs to be switched to operative state and the other of said FETs to be switched to inoperative state.

12. The microwave mixing circuitry as recited in claim 11, wherein said control circuitry comprises a couple of transistors and a base bias circuitry coupled with said transistors, and wherein each collector and each emitter of said transistors are coupled with each gate and each drain of said FETs respectively.

13. The microwave mixing circuitry as recited in claim 12, wherein said base bias circuitry changes dc voltages applied to the bases of said transistors in order for said transistors to switch between conductive state and non-conductive state.

14. The microwave mixing circuitry as recited in claim 12, wherein said base bias circuitry is comprised of a two-stage cascaded comparator, and the output voltages of the first stage and the second stage of said comparator are applied to the bases of said transistors respectively.

15. The microwave mixing circuitry as recited in claim 11, wherein a Wilkinson-type divider is provided between the drains of said FETs and said intermediate frequency signal output terminal.

16. The microwave mixing circuitry as recited in claim 11, wherein two orthogonal polarized microwave input signals (H1 and V1) are transmitted from a first signal sources (S1), guided into a waveguide (W1), mode-converted by two orthogonal waveguide probes (P1 and Q1), fed into low-noise amplifiers (L1 and M1) and one of said signals (H1 and V1) is applied to a first terminal of said microwave input terminals, and wherein other two orthogonal polarized microwave input signals (H2 and V2) are transmitted from a second signal sources (S2), guided into a waveguide (W2), mode-converted by two orthogonal waveguide probes (P2 and Q2), fed into low-noise amplifiers (L2 and M2) and one of said signals (H2 and V2) is applied to a second terminal of said microwave input terminals.

17. The microwave mixing circuitry as recited in claim 16, wherein said control circuitry switches one of said low-noise amplifiers (L1 and M1) to operative state and the other of L1 and M1 to inoperative state by controlling dc supply voltages of L1 and M1, and wherein said control circuitry switches one of said low-noise amplifiers (L2 and M2) to operative state and the other of L2 and M2 to inoperative state by controlling dc supply voltages of L2 and M2.

18. The microwave mixing circuitry as recited in claim 11, wherein one of said microwave input signal (H1 and V1) are fed into said FETs by using a first control signal which is fed into said control circuitry in order to switch one of said low-noise amplifiers (L1 and M1) to operative state and the other of said low-noise amplifiers (L1 and M1) to inoperative state and one of said microwave input signals (H2 and V2) are fed into said FETs by using a first control signal which is fed into said control circuitry in order to switch one of said low-noise amplifiers (L2 and M2) to operative state and the other of said low-noise amplifiers (L2 and M2) to inoperative state, and wherein one arbitrary signal of said microwave input signals (H1, V1, H2, V2) is selectively down-converted to an intermediate frequency signal by using a second control signal fed into said control circuit in order to switch one of said FETs to operative state and the other of said FETs to inoperative state.

19. The microwave mixing circuitry as recited in claim 18, wherein said control circuitry includes a band-pass filter circuitry which filters a time-varying signal from the control signals fed into said control circuitry and a detector circuitry which produces a dc signal from said time-varying signal.

* * * * *